(12) United States Patent
Liu

(10) Patent No.: US 12,188,628 B1
(45) Date of Patent: Jan. 7, 2025

(54) EAVES LAMP STRUCTURE WITH SEGMENTED PROTECTIVE COVER

(71) Applicant: Rainmin Intelligent Technology Co., Ltd., Dongguan (CN)

(72) Inventor: Xiaoyan Liu, Dongguan (CN)

(73) Assignee: Rainmin Intelligent Technology Co., Ltd., Dongguan (CN)

( * ) Notice: Subject to any disclaimer, the term of this patent is extended or adjusted under 35 U.S.C. 154(b) by 0 days.

(21) Appl. No.: 18/663,858

(22) Filed: May 14, 2024

(30) Foreign Application Priority Data

Apr. 23, 2024 (CN) .......................... 202420855128.5

(51) Int. Cl.
| | |
|---|---|
| F21S 4/00 | (2016.01) |
| F21S 4/22 | (2016.01) |
| F21V 17/16 | (2006.01) |
| F21W 131/10 | (2006.01) |
| F21Y 115/10 | (2016.01) |
| H05K 9/00 | (2006.01) |

(52) U.S. Cl.
CPC .............. *F21S 4/22* (2016.01); *F21V 17/164* (2013.01); *F21W 2131/10* (2013.01); *F21Y 2115/10* (2016.08); *H05K 9/0058* (2013.01)

(58) Field of Classification Search
CPC ...... F21S 4/22; F21W 2131/10; H05K 9/0058
See application file for complete search history.

(56) References Cited

U.S. PATENT DOCUMENTS

| | | | |
|---|---|---|---|
| 7,159,997 B2 | 1/2007 | Reo et al. | |
| 7,531,972 B1* | 5/2009 | Worsham | F21S 8/033 |
| | | | 362/372 |
| 11,662,085 B1* | 5/2023 | Guo | F21V 17/16 |
| | | | 362/396 |
| 2022/0082221 A1* | 3/2022 | Paredes | F21S 8/033 |
| 2022/0316667 A1* | 10/2022 | Xiao | F21V 27/02 |
| 2023/0408050 A1* | 12/2023 | Chen | F21V 17/164 |
| 2024/0084982 A1* | 3/2024 | Xiong | H01R 24/60 |
| 2024/0110690 A1* | 4/2024 | Yu | F21S 8/02 |

FOREIGN PATENT DOCUMENTS

CN 218153765 U 12/2022

* cited by examiner

*Primary Examiner* — Gerald J Sufleta, II
(74) *Attorney, Agent, or Firm* — Westbridge IP LLC

(57) ABSTRACT

An eaves lamp structure with a segmented protective cover includes a base, a lamp string, and a shielding cover. Two sides of the base are extended upwards with flexible clamping arms, and the two flexible clamping arms enclose a clamping cavity; the lamp string comprises multiple lamp bodies and a cable connecting adjacent two lamp bodies, the shape of the lamp body is suitable for the clamping cavity and can be detachably installed between the two flexible clamping arms; the shielding cover can be detachably installed in the clamping cavity and arranged between the two lamp bodies, the cable is shielded inside the shielding cover, and two sides of the shielding cover are in contact with the side ends of the lamp body and limit the lamp body. By setting the flexible clamping arm on the base, the installation of the lamp string and shielding cover is achieved.

10 Claims, 4 Drawing Sheets

EAVES LAMP STRUCTURE WITH SEGMENTED PROTECTIVE COVER

CROSS-REFERENCE TO RELATED APPLICATIONS

This application claims priority to Chinese Patent Application No. 202420855128.5, filed on Apr. 23, 2024, the content of which is incorporated herein by reference in its entirety.

TECHNICAL FIELD

The present application herein relates to the field of architectural lighting, in particular to an eaves lamp structure with a segmented protective cover thereof.

BACKGROUND

In the field of outdoor building lighting (such as eaves lamps), positioning seats are generally used, and a cavity is set up in the positioning seat to install LED lamps. However, the installation of existing LED lamps is more complicated, such as the Chinese Patent Publication CN218153765U, which uses a flexible base to fix cables and LED lamps. However, the production cost of the lens is high, and the shielding effect on the cables is poor. Assuming that the cable positioning is not in place, it will partially adhere to the lens, thereby affecting the lighting effect. And this design is also not suitable for the installation of lamp strings, especially when the base length is long, longer lampshades need to be installed one by one, and it is necessary to divide each lamp body one by one to improve the lighting effect and meet the predetermined lighting requirements (especially for controllable color lamps, when the spacing is inconsistent, their color changes will appear abrupt in local areas, affecting visual aesthetics).

SUMMARY

The main purpose of the present application is to propose an eaves lamp structure with segmented protective cover, aiming to improve the installation structure of the lamp string, so that each lamp body is segmented one by one, and the cables between the two lamp bodies can be blocked one by one, thereby enhancing the beauty of the building lamp.

To achieve the above objectives, the present application proposes an eaves lamp structure with segmented protective cover, comprising:

a base, where two sides of the base are extended upwards with flexible clamping arms, and the two flexible clamping arms enclosing a clamping cavity;

a lamp string, the lamp string comprises multiple lamp bodies and a cable connecting adjacent two lamp bodies, where the shape of the lamp body is suitable for the clamping cavity and can be detachably installed between the two flexible clamping arms; and a shielding cover, the shielding cover can be detachably installed in the clamping cavity and arranged between the two lamp bodies, the cable is shielded inside the shielding cover, and two sides of the shielding cover are in contact with the side ends of the lamp body and limit the lamp body.

In actual design, by setting the flexible clamping arm on the base, the installation of the lamp string and shielding cover is achieved, at the same time, the shielding cover is set to block the lamp string cable, and the spacing between the two lamp bodies is the same, when the appearance of the building needs lighting, the distribution of the lighting effect is consistent through the predetermined distribution, thereby improving the aesthetics of the building; the flexible clamping arm facilitates the installation of the lamp string and the shielding cover, and the shielding cover reduces the fixation of the cable and covers them, effectively improving its aesthetics, its short length makes it easy to disassemble and install, while the transportation and production costs are lower.

The eaves lamp structure is a low-voltage, concealed, outdoor, and linear architectural lighting system designed for customized installation. The lamp body and the cable have sealed and waterproof properties to ensure service life and stability, and to avoid damage or malfunction caused by foreign objects.

DETAILED DESCRIPTION OF THE EMBODIMENTS

The following will provide a clear and complete description of the technical solution in the examples of the present application, in conjunction with the accompanying drawings. Obviously, the described examples are only a part of the examples of the present application, not all of them. Based on the examples in the present application, all other examples obtained by a person of ordinary skill in the art without creative labor fall within the scope of protection of the present application.

It should be noted that if there are directional indications (such as up, down, left, right, front, back, top, bottom, inside, outside, vertical, horizontal, vertical, counterclockwise, clockwise, circumferential, radial, axial, etc.) involved in the examples of the present application, the directional indication is only used to explain the relative position relationship and motion situation between the components in a specific posture (as shown in the accompanying drawings). If the specific posture changes, the directional indication also changes accordingly.

In addition, if there are descriptions related to "first" or "second" in the examples of the present application, the descriptions of "first" or "second" are only used for descriptive purposes and cannot be understood as indicating or implying their relative importance or implying the number of indicated technical features. Therefore, the features limited to "first" and "second" can explicitly or implicitly include at least one of these features. In addition, the technical solutions between various examples can be combined with each other, but must be based on what can be achieved by a person of ordinary skill in the art; when the combination of technical solutions conflicts or cannot be achieved, it should be considered that the combination of such technical solutions does not exist and is not within the protection scope required by the present application.

Figure 1:
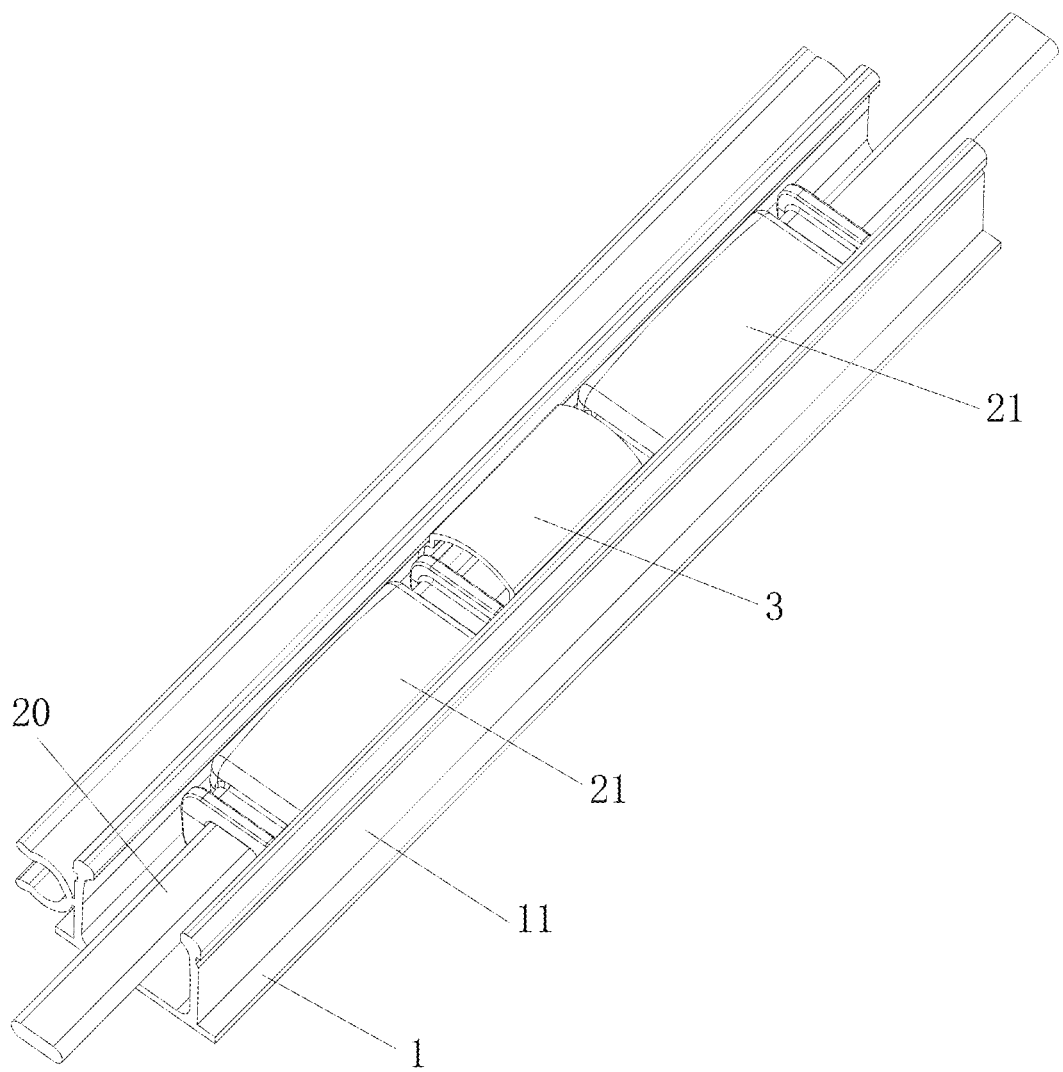
FIG. 1 shows a three-dimensional schematic diagram according to the present application.
Figure 2:
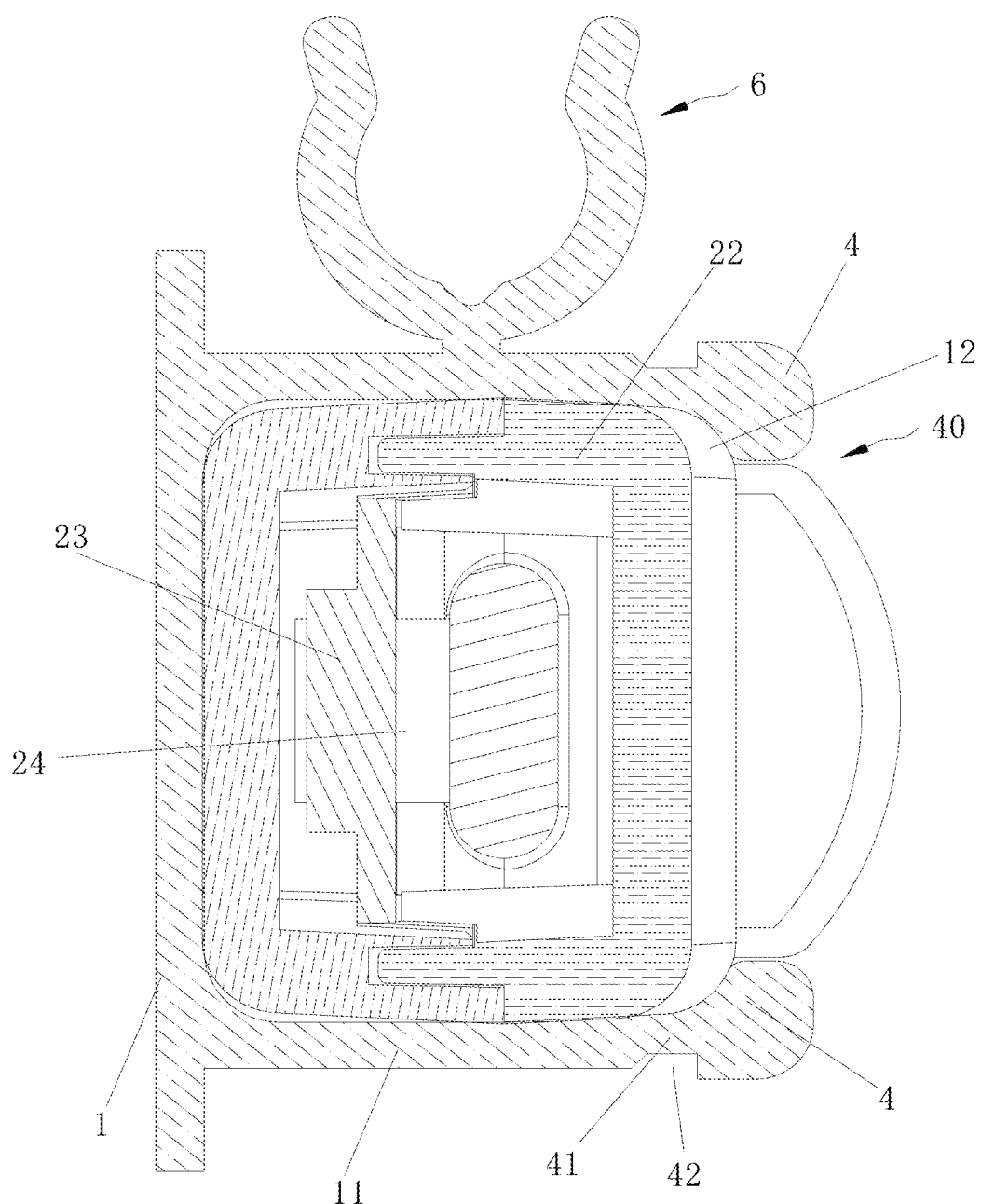
FIG. 2 shows a sectional view of a lamp body according to the present application.
Figure 3:
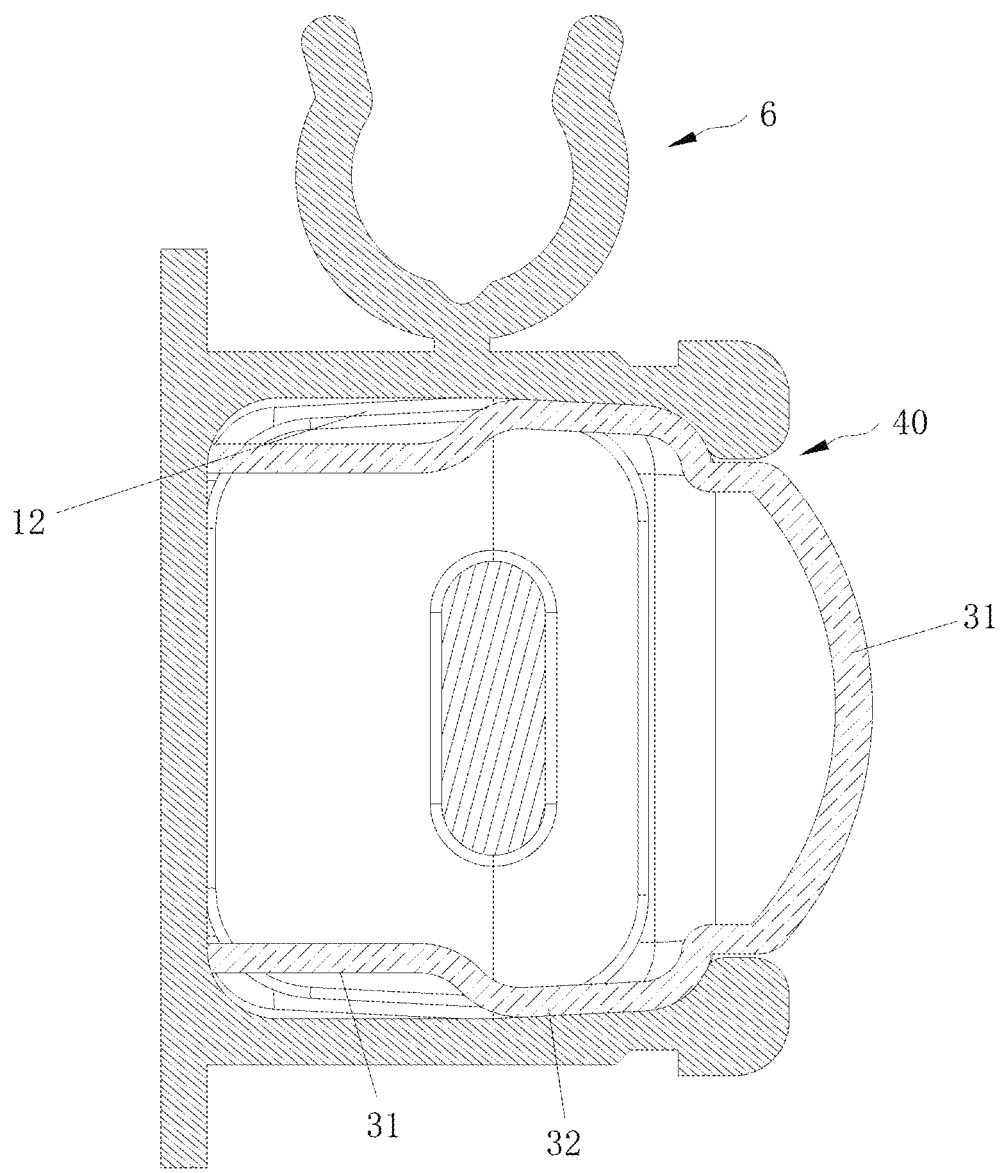
FIG. 3 shows a sectional view of a shielding cover according to the present application.
Figure 4:
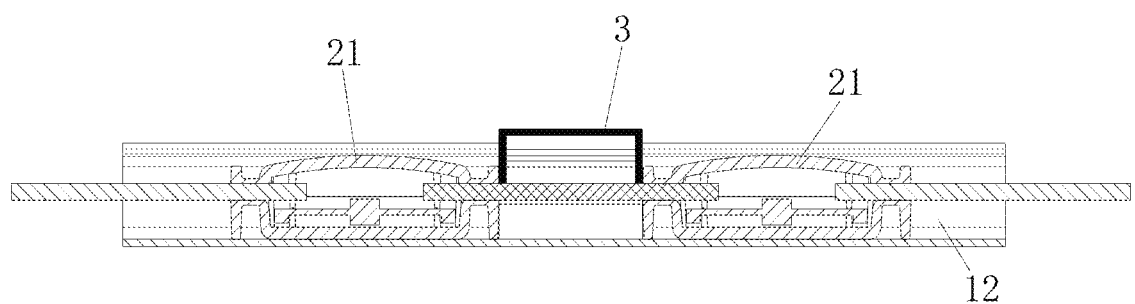
FIG. 4 shows a schematic diagram of a shielding cover is stuck on a lamp body housing according to the present application.
Figure 5:
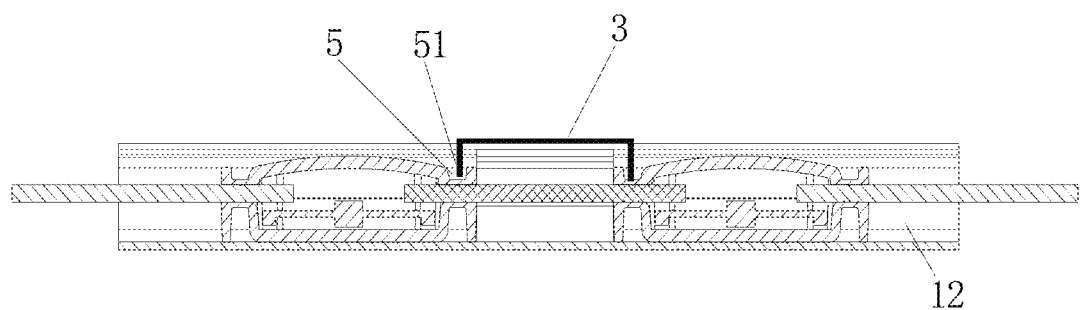
FIG. 5 shows a schematic diagram of a shielding cover is in contact with both sides of a lamp body according to the present application.

As shown in FIGS. 1 to 5, an eaves lamp structure with a segmented protective cover comprises a base 1, a lamp string 2 and a shielding cover 3.

Two sides of the base 1 are extended upwards with flexible clamping arms 11, and the two flexible clamping arms 11 enclose a clamping cavity 12.

The lamp string 2 comprises multiple lamp bodies 21 and a cable 20 connecting adjacent two lamp bodies 21, the shape of the lamp body 21 is suitable for the clamping cavity 12 and can be detachably installed between the two flexible clamping arms 11.

The shielding cover 3 can be detachably installed in the clamping cavity 12 and arranged between the two lamp bodies 21, the cable 20 is shielded inside the shielding cover 3, and two sides of the shielding cover 3 are in contact with the side ends of the lamp body 21 and limit the lamp body 21.

In actual design, by setting the flexible clamping arm 11 on the base 1, the installation of the lamp string 2 and shielding cover is achieved, at the same time, the shielding cover is set to block the lamp string 2 cable 20, and the spacing between the two lamp bodies 21 is the same, when the appearance of the building needs lighting, the distribution of the lighting effect is consistent through the predetermined distribution, thereby improving the aesthetics of the building.

The flexible clamping arm 11 facilitates the installation of the lamp string 2 and the shielding cover, and the shielding cover 3 reduces the fixation of the cable 20 and covers them, effectively improving its aesthetics, its short length makes it easy to disassemble and install, while the transportation and production costs are lower.

The base, the flexible clamping arm, and the shielding cover 3 can be extruded from plastic materials.

The eaves lamp structure is a low-voltage, concealed, outdoor, and linear architectural lighting system designed for customized installation. The lamp body 21 and the cable 20 have sealed and waterproof properties to ensure service life and stability, and to avoid damage or malfunction caused by foreign objects.

Specifically, the upper end of the flexible clamping arm 11 extends a limiting convex portion 4 towards the middle direction of the clamping cavity 12, the limiting convex portion 4 is distributed along the length direction of the base 1, and the limiting convex portion 4 enclosing a positioning opening 40 with a width smaller than the width of the clamping cavity 12. By setting the limiting convex portion 4, the lamp body 21 and the shielding cover 3 are limited to the clamping cavity 12.

Furthermore, a neck 41 is provided between the limiting convex portion 4 and the flexible clamping arm 11, and the neck 41 is provided with a deformation groove 42, and the wall thickness of the limiting convex portion 4 is greater than that of the flexible clamping arm 11. Through the combination of neck 41 and deformation groove 42, when the limiting convex portion 4 is subjected to pressure deformation, the limiting convex portion 4 uses neck 41 as the fulcrum to compress the deformation groove 42, thereby achieving elastic swing of the limiting convex portion 4, its structural stability is better, and its bending resistance is better, at the same time, the structure is simpler and more stable. The base 1, the flexible clamping arm 11, the limiting convex portion 4, the neck 41, and the deformation groove 42 are integrated by extrusion molding.

In the example of the present application, one of the two limiting convex portions 4 has a wall thickness greater than the other. The wall thickness of one of the limiting convex portions 4 is greater than that of the other limiting convex portion 4, making installation and disassembly more convenient, of course, the same wall thickness of the two limiting convex portions 4 can also facilitate disassembly; by using the difference in wall thickness, the lamp body 21 can extend towards the smaller wall thickness or block the extension of the shielding cover during extrusion deformation.

Furthermore, two ends of the shielding cover 3 are in contact with the side walls of the lamp body 21 or are stuck at the ends of the shielding cover 3, when the two ends of the shielding cover 3 are stuck at the end of the shielding part, the two ends of the lamp body 21 are provided with clamping grooves 5, and the shielding cover 3 is provided with a limiting portion 51 that extend into the clamping grooves 5.

In the example of the present application, the shielding cover 3 is a semitransparent or opaque structure, when the two ends of the shielding cover 3 are stuck in the clamping groove 5, the light of the lamp body 21 is refracted to the semitransparent shielding cover 3 through its housing 22, thereby making the building lighting effect more aesthetically pleasing; of course, the shielding cover 3 can also be an opaque structure, only for the shielding of cable 20.

Furthermore, the shielding cover 3 comprises a top cover 31 and side wings 32 extending downwards from both sides of the top cover 31, the side wing 32 extend into the positioning opening and are limited to the flexible clamping arm 11, thereby achieving the installation and fixation of the shielding cover 3.

In the example of the present application, the width between the two side wings 32 is suitable for the width of the positioning opening 40, and there is a convex bar 33 extending outward from the middle of the side wing 32, and the width of the two convex bars 33 is smaller than the width of the positioning opening 40, thereby facilitating the guidance and insertion of the shielding cover 3 into the side wing.

Furthermore, the lamp body 21 comprises a transparent housing 22, a PCB board 23 provided inside the transparent housing 22, an LED lamp 24 installed on the PCB board, and the cable 20 extends into the transparent housing 22 and is connected to the PCB board, thereby achieving the design requirements of building lighting.

In the example of the present application, one side of the flexible clamping arm 11 is further provided with a hoop groove 6. The setting of the hoop groove is convenient for the installation and fixation of the base 1, and of course, the base 1 can also be directly fixed by screws.

The upper wall of the shielding cover is higher than the upper wall of the lamp body or flush with the upper wall of the lamp body.

The above is only a preferred example of the present application and does not limit the scope of the patent of the present application. Any equivalent structural changes made using the description and accompanying drawings of the present application, or directly/indirectly applied in other related technical fields, are included in the scope of patent protection of the present application.

What is claimed is:
1. An eaves lamp structure with a segmented protective cover, comprising:

a base, wherein two sides of the base are extended upwards with flexible clamping arms, and the two flexible clamping arms enclose a clamping cavity;

a lamp string, wherein the lamp string comprises multiple lamp bodies and a cable connecting adjacent two lamp bodies, a shape of the lamp body is suitable for the clamping cavity and is capable of being detachably installed between the two flexible clamping arms; and a shielding cover, wherein the shielding cover is capable of being detachably installed in the clamping cavity and arranged between the two lamp bodies, the cable is shielded inside the shielding cover, and two sides of the shielding cover are in contact with side ends of the lamp body and limit the lamp body.

2. The eaves lamp structure according to claim 1, wherein an upper end of the flexible clamping arm extends a limiting convex portion towards a middle direction of the clamping cavity, the limiting convex portion is distributed along a length direction of the base, and the limiting convex portion encloses a positioning opening with a width smaller than a width of the clamping cavity.

3. The eaves lamp structure according to claim 2, wherein a neck is provided between the limiting convex portion and the flexible clamping arm, and the neck is provided with a deformation groove, and a wall thickness of the limiting convex portion is greater than that of the flexible clamping arm.

4. The eaves lamp structure according to claim 2, wherein one of the two limiting convex portions has a wall thickness greater than the other.

5. The eaves lamp structure according to claim 2, wherein two ends of the shielding cover are in contact with side walls of the lamp body or are stuck at the two ends of the shielding cover;

when the two ends of the shielding cover are stuck at an end of the shielding part, the two ends of the lamp body are provided with clamping grooves, and the shielding cover is provided with a limiting portion that extend into the clamping grooves.

6. The eaves lamp structure according to claim 1, wherein the shielding cover is a semitransparent structure or an opaque structure.

7. The eaves lamp structure according to claim 2, wherein the shielding cover comprises a top cover and side wings extending downwards from both sides of the top cover, the side wing extends into the positioning opening and are limited to the flexible clamping arm.

8. The eaves lamp structure according to claim 7, wherein the width between the two side wings is suitable for a width of the positioning opening, and a convex bar extends outward from a middle of the side wing, and a width of the two convex bars is smaller than a width of the positioning opening.

9. The eaves lamp structure according to claim 1, wherein the lamp body comprises a transparent housing, a Printed Circuit Board (PCB) board provided inside the transparent housing, and a Light-Emitting Diode (LED) lamp installed on the PCB board, and the cable extends into the transparent housing and is connected to the PCB board.

10. The eaves lamp structure according to claim 1, wherein one side of the flexible clamping arm is provided with a hoop groove.

* * * * *